United States Patent
De Keyser

(10) Patent No.: US 10,935,016 B2
(45) Date of Patent: Mar. 2, 2021

(54) METHOD FOR PROTECTING AN ELECTRIC MOTOR OF A DEVICE WITH A MOTOR DRIVEN CONSUMER WITH A CONTINUOUS CAPACITY CONTROL SYSTEM AND CHOICE OF SUCH A MOTOR

(71) Applicant: ATLAS COPCO AIRPOWER, NAAMLOZE VENNOOTSCHAP, Wilrijk (BE)

(72) Inventor: Karel De Keyser, Wilrijk (BE)

(73) Assignee: ATLAS COPCO AIRPOWER, NAAMLOZE VENNOOTSCHAP, Wilrijk (BE)

( * ) Notice: Subject to any disclaimer, the term of this patent is extended or adjusted under 35 U.S.C. 154(b) by 104 days.

(21) Appl. No.: 16/091,343

(22) PCT Filed: Apr. 5, 2017

(86) PCT No.: PCT/BE2017/000023
§ 371 (c)(1),
(2) Date: Oct. 4, 2018

(87) PCT Pub. No.: WO2017/177287
PCT Pub. Date: Oct. 19, 2017

(65) Prior Publication Data
US 2019/0154024 A1 May 23, 2019

(30) Foreign Application Priority Data

Apr. 12, 2016 (BE) .................................. 2016/5256
Nov. 4, 2016 (BE) .................................. 2016/5824

(51) Int. Cl.
*F04B 39/06* (2006.01)
*H02P 29/64* (2016.01)
(Continued)

(52) U.S. Cl.
CPC ............. *F04B 39/066* (2013.01); *F04B 35/04* (2013.01); *F04B 39/06* (2013.01); *F04B 49/06* (2013.01);
(Continued)

(58) Field of Classification Search
CPC ............. F04D 15/0066; H02H 7/0852; H02H 7/0858; H02H 29/02
See application file for complete search history.

(56) References Cited

U.S. PATENT DOCUMENTS 3,585,451 A † 6/1971 Day
7,615,951 B2 † 11/2009 Son
(Continued)

FOREIGN PATENT DOCUMENTS

DE 4122002 C1 8/1992
DE 29913196 A2 1/2001
(Continued)

OTHER PUBLICATIONS

Belgium Search Report and Written Opinion in related Belgium Application No. 201705700, dated May 30, 2018.
(Continued)

*Primary Examiner* — Patrick Hamo
(74) *Attorney, Agent, or Firm* — Bacon & Thomas, PLLC

(57) ABSTRACT

Method for protecting an electric motor of a motor driven consumer equipped with a controller for controlling the capacity or the power of the consumer, comprises the following steps:
  the determination of the thermal condition of the motor by direct measurement on the motor; and
  the limitation of the maximum capacity or the maximum power of the consumer as a function of the aforementioned determined thermal condition.

24 Claims, 2 Drawing Sheets

(51) Int. Cl.
*H02K 11/25* (2016.01)
*H02P 29/032* (2016.01)
*F04B 35/04* (2006.01)
*F04B 49/06* (2006.01)
*F04B 49/20* (2006.01)
*F04B 49/22* (2006.01)
*F04D 27/02* (2006.01)
*F25B 49/02* (2006.01)
*G05B 23/02* (2006.01)
*H02H 7/085* (2006.01)
*G01R 31/34* (2020.01)
*H02P 29/68* (2016.01)
*H02H 6/00* (2006.01)
*G07C 3/00* (2006.01)
*G06F 11/00* (2006.01)
*F04B 51/00* (2006.01)
*F25B 1/053* (2006.01)

(52) U.S. Cl.
CPC ............ *F04B 49/065* (2013.01); *F04B 49/20* (2013.01); *F04B 49/225* (2013.01); *F04B 51/00* (2013.01); *F04D 27/0261* (2013.01); *F04D 27/0292* (2013.01); *F25B 49/025* (2013.01); *G01R 31/343* (2013.01); *G05B 23/0235* (2013.01); *G06F 11/008* (2013.01); *G07C 3/00* (2013.01); *H02H 6/00* (2013.01); *H02H 7/085* (2013.01); *H02H 7/0857* (2013.01); *H02K 11/25* (2016.01); *H02P 29/032* (2016.02); *H02P 29/64* (2016.02); *H02P 29/68* (2016.02); *F04B 2203/0201* (2013.01); *F04B 2203/0202* (2013.01); *F04B 2203/0205* (2013.01); *F25B 1/053* (2013.01); *F25B 49/022* (2013.01); *F25B 2600/0253* (2013.01); *F25B 2700/21156* (2013.01); *Y02B 30/70* (2013.01)

(56) References Cited

U.S. PATENT DOCUMENTS

| | | | | |
|---|---|---|---|---|
| 8,614,538 B2* | 12/2013 | Bradfield | ................. | H02K 5/18 |
| | | | | 310/407 |
| 8,700,444 B2* | 4/2014 | Singh | .................... | G06Q 50/06 |
| | | | | 705/7.35 |
| 8,964,338 B2* | 2/2015 | Wallis | .................... | H02H 5/041 |
| | | | | 361/24 |
| 9,140,728 B2* | 9/2015 | Jayanth | ................. | F04D 27/001 |
| 9,310,439 B2* | 4/2016 | Pham | .................. | F04C 29/0085 |
| 9,531,304 B2* | 12/2016 | Herranz Gracia | ........ | H02P 9/30 |
| 2009/0066283 A1 | 3/2009 | Son et al. | | |
| 2012/0101768 A1† | 4/2012 | Moojanattu | | |
| 2014/0265656 A1 | 9/2014 | Dedrich | | |

FOREIGN PATENT DOCUMENTS

| | | |
|---|---|---|
| DE | 29913196 U1 † | 1/2001 |
| EP | 1172563 A2 † | 1/2001 |
| GB | 2478361 A † | 7/2011 |
| JP | 53025848 A | 3/1978 |
| JP | H01164225 A | 6/1989 |
| JP | 2002009966 A | 1/1990 |
| JP | 04060345 A | 2/1992 |
| JP | 2001129522 A | 5/2001 |
| JP | 2002081391 A | 3/2002 |
| JP | 2003047220 A | 2/2003 |
| JP | 2003083258 A | 3/2003 |
| JP | 2003294543 A | 10/2003 |
| JP | 2012107589 A | 6/2012 |
| JP | 2012528301 | 11/2012 |
| WO | 0016464 A2 | 3/2000 |
| WO | 200016464 A2 † | 3/2000 |
| WO | 2007008940 A2 | 1/2007 |
| WO | 2009027623 A1 † | 3/2009 |
| WO | 20142366 A1 | 12/2010 |
| WO | 2011040845 † | 4/2011 |
| WO | 2011040845 A1 | 4/2011 |

OTHER PUBLICATIONS

International Search Report in related PCT Application No. PCT/BE2017/000023, dated May 7, 2018.

Written Opinion in related PCT Application No. PCT/BE2017/000023, dated May 7, 2018.

International Preliminary Report on Patentability in related PCT Application No. PCT/BE2017/000023, dated Sep. 14, 2018.

\* cited by examiner
† cited by third party

METHOD FOR PROTECTING AN ELECTRIC MOTOR OF A DEVICE WITH A MOTOR DRIVEN CONSUMER WITH A CONTINUOUS CAPACITY CONTROL SYSTEM AND CHOICE OF SUCH A MOTOR

Method for protecting an electric motor of a device with a motor driven consumer with a continuous capacity control system and choice of such a motor.

The invention relates to an electric motor of a motor driven consumer with a continuous capacity control system.

BACKGROUND OF THE INVENTION

More specifically, but not limited to this, the invention relates to a consumer in the form of a compressor for compressing gas and driven by an electric motor.

In the case of a compressor, the capacity of the consumer is expressed as the maximum flow of compressed gas that the compressor can supply, for example expressed in litres per time unit with imposed inlet conditions of the gas to be compressed drawn in. The maximum capacity of a compressor closely depends on the maximum power of the compressor, whereby the power depends on the aforementioned capacity and the pressure at the output of the compressor.

With compressors, the capacity can be controlled for example by controlling the speed of the electric motor to maintain a certain pressure at the output of the compressor. When with such a control, this pressure falls for example because the consumption of compressed gas increases, then the controller for controlling the capacity will make the speed of the motor increase to thereby increase the flow of compressed gas supplied and thereby also to increase the pressure downstream from the compressor.

In this case the capacity is thus controlled by controlling the speed.

Other types of capacity control of compressors are known, that are equipped with variable inlet vanes or with variable outlet vanes that can be rotated around their longitudinal axis and in this way can affect the flow of gas through the compressor.

It is known that the power of compressors depends on the ambient conditions. For example a cold inlet temperature and a high ambient pressure will increase the inlet density of the gas drawn in, which brings about an increase in the capacity and the power consumption.

Additionally it is also known that the power can increase over the lifetime, primarily on account of increased losses and leaks.

As the electric motor is typically the next to most expensive component of a compressor device, no risk can be taken in the design of the size of the components. Uncertainty relating to the operating conditions and the ageing behaviour brings about a significant compromise in the favour of overdimensioning the motor.

Significant electric motor defects are thermally related, for example due to the degradation of the insulation of the windings at high temperatures and primarily the failure of the anti-friction bearings due to degeneration of the lubricant at higher temperatures. These temperatures are primarily affected by the mechanical load and the cooling conditions of the motor.

The following methods are applied today to protect the electric motor.

A first known method for protecting the motor relies on a conservative choice of components based on an estimate of the power and the cooling conditions in a hypothetical worst-case scenario.

During the design the power and cooling conditions of the motor are estimated on the basis of an assumption of the worst operating conditions and the poorest performance reduction factor on account of ageing.

The conditions are typically estimated by the compressor manufacturer, while the determination of the required size of the electric motor is typically done by the motor supplier, whereby a highly improbable but possible situation is generally assumed.

A disadvantage of the first known method is that it ensures an overdimensioning of the electric motor, typically by a factor of 20%, for the bulk of the operating time of its lifetime. The lifetime cost of the device is thus significantly increased.

Indeed, this overdimensioning occurs on two levels, i.e. at the level of the compressor manufacturer due to an overestimate of the power in the worst case, and at the level of the motor supplier on account of estimates coupled to the estimate of the thermal condition of the motor based on the worst power and cooling specifications.

Another disadvantage is that the method does not provide a guarantee in real time that the estimates and assumptions remain valid or respected during the lifetime of the electric motor. Indeed, a reduced lifetime of the motor and an unexpected premature failure are elements that can occur.

A second known method relies on an 'overload' protection based on an estimate of the electric power and the cooling conditions.

This second method typically makes use of:
- a compressor with a continuous capacity control system;
- an electric motor cooled by means of a coolant, for example air or water;
- a measuring device that measures the (average) current in one phase or in all phases of the electric motor; and,
- a measuring instrument that measures the temperature of the coolant.

With this second method the current mechanical power is estimated by the control system based on the present measurement of the current and temperature and assumptions relating to voltage, power factor and motor losses.

In this case, the current cooling condition of the motor is estimated, based on the measured inlet temperature of the coolant, an (implicit) assumption of the density of the coolant, the cooling flow and the heat transfer performance. This current actual cooling condition is then converted into a current maximum permissible mechanical power, based on conversion rules that are provided by the motor supplier.

If the control system detects that the estimated current mechanical power exceeds the maximum permissible mechanical power, the maximum capacity of the compressor is capped, i.e. limited, to protect the electric motor against overload. Typically a PI or PID control circuit is activated to reduce the estimated current mechanical power to the set point of the current maximum permissible mechanical power. The control system typically gradually enables more capacity when the power has decreased to below a threshold value for a certain time.

This second method for protecting the motor provides two advantages, i.e:
- the specifications of the compressor manufacturer can be relaxed from the highly improbable but possible to realistic worst conditions
- there is a certain form of real-time protection of the motor.

The second method nevertheless has a number of disadvantages, more specifically:

- the method is indirect for the estimate of the thermal condition of the motor, whereby in fact all the relevant factors below are not correctly evaluated and consequently must be compensated by overdimensioning, which increases the cost price of the motor:
  - deviation of the voltage;
  - imbalance of the motor phases;
  - low density of the coolant;
  - insufficient flow of the coolant;
  - insufficient heat transfer across an (internal) heat exchanger on account of fouling of this last-mentioned;
  - the accuracy of the measured electric current;
  - etc;
- the motor supplier is conservative in specifying the conversion rules as he still has to assess the thermal condition of the motor only on the basis of two parameters;
- typically the system is jumpy on account of time constants of the electric current that are too short. Short variations of the measured current can bring about unnecessary reactions of the control system;
- the method for protecting the motor must be switched off temporarily when starting up the motor as high currents can occur during start-up;
- measuring instruments for measuring electric current are expensive;
- the system must be configured for each motor size and installation;
- for larger motors the measuring instrument for electric current must typically be provided on a customer level, which complicates the commissioning process because:
  - a physical connection must be made to the compressor control system;
  - the In/Out interface of the external current signal should be calibrated during commissioning, which is almost never done as it is too laborious;
  - the precision of the measuring instrument for electric current is not known during the design of the motor, such that a value must be assumed in the worst-case scenario, which implicitly gives rise to additional overdimensioning;
- the system depends on two input signal signals, i.e. a current and a temperature that cannot be compared to one another, such that a self-diagnosis/evaluation cannot be implemented.

SUMMARY OF THE INVENTION

The purpose of the invention is to provide a solution to one or more of the aforementioned and other disadvantages.

To this end the invention concerns a method for protecting an electric motor of a motor driven consumer equipped with a controller for controlling the capacity or the power of the consumer, characterised in that the method comprises the following steps:
- the determination of the thermal condition of the motor by direct measurement on the motor; and
- the limitation of the maximum capacity or the maximum power of the consumer as a function of the aforementioned determined thermal condition; and in that
- the electric motor is provided with one or more electric windings and with one or more bearings, whereby for the determination of the thermal condition of the motor the method comprises the step of measuring the temperature of one or more windings (U-V-W) and/or of one or more bearings.

In such a case, the electric motor is equipped with sensors for the temperature of the windings and/or of the bearings that are directly connected to the controller for controlling the capacity of the consumer. The controller will cap the flow capacity of the compressor and cap the power when one of the thermal limits is reached or exceeded, i.e. when one of the measured temperatures reaches or exceeds a preset maximum value of the temperature, whereby for each of the sensors, or for at least some of them, a corresponding maximum temperature is specified.

An evaluation of the thermal condition of the motor can depend of one or every possible combination of the following measured temperatures that are used by the motor designers:
- the absolute temperature of one or more winding(s) and this measured at one or more positions along the windings;
- the temperature difference between the motor winding and the inlet temperature of the coolant, the 'delta T';
- the absolute temperature of one or more bearing(s), respectively one or more bearings (DE) on the driven end of the motor and/or one or more bearing(s) (NDE) on the non-driven end of the motor.

The direct approach of the method according to the invention eliminates the need for estimates and assumptions of all types as described above. This provides the advantage that overdimensioning can be prevented and a smaller motor with a lower cost will result from this. Indeed, the specifications of the compressor manufacturer may be relaxed from the highly improbable but possible condition to realistic worst-case conditions, while for the motor supplier all assumptions relating to an estimate of the thermal condition of the motor can be eliminated.

Another advantage is that sensors for measuring the temperature are much cheaper than measuring instruments for measuring an electric current, which further reduces the cost of the design of the motor driven consumer or which enables a number of sensors to be utilised for the same cost for a more accurate evaluation of the thermal condition of the motor and protection of the motor arising from this.

Another advantage is that temperature limits are generally universal and independent of the motor site, such that less configuration is required.

Furthermore, motor suppliers typically offer preinstalled temperature sensors as an option, which provides an advantage in terms of integration and logistics for the compressor manufacturer.

Another advantage is that a device can be completely prepared and inspected by the compressor manufacturer and that actions such as connection, calibration, validation and similar during commissioning can be eliminated.

An additional advantage is that the thermal time response of the device is much slower, which preferentially makes the dynamics of the control system much less jumpy.

Another extra advantage is that with the application of a method according to the invention, it is not necessary to switch off the control system during the start-up in order to prevent a motor shutdown as a result of current peaks. The time that is needed to overheat the motor when starting up is longer than the start-up time.

Preferably with a three-phase motor the temperatures of the three windings are measured. A self-diagnosis system can then be implemented to detect the failure of one of the sensors and thus to prevent an undesired premature immediate shutdown of the motor and the driven consumer. From the point of view of a self-diagnosis of the sensors, the method could for example be equipped to compare each signal from the three sensors to the other two in order to be able to detect a defective sensor when the difference is too great and then to ignore the signal from this defective sensor, after an inspection or otherwise.

An advantage of a number of independent sensors is that from a statistical point of view the accuracy is significantly higher than in the case of a single (electric current) measuring instrument.

The method for protecting the electric motor can also be applied to other types of driven consumers such as expanders, pumps, ventilators, coolers and similar that are equipped with a continuous capacity control system that is suitable for truncating the power, for example by adjusting the speed, by controlling the inlet guide vanes and/or outlet guide vanes, throttle valves or similar to control the flow.

In particular the method is suitable for application to centrifugal compressors with variable inlet guide vanes (IGV).

The invention also relates to a device for protecting an electric motor of a motor driven consumer equipped with a controller for controlling the capacity or the power of the consumer, whereby the device is provided with sensors for determining the thermal condition of the motor by direct measurement on the motor, and is provided with means for limiting the maximum capacity or the maximum power of the consumer as a function of the aforementioned determined thermal condition, and whereby electric motor is provided with one or more electric windings and with one or more bearings and that the means for the determination of the thermal condition of the motor are formed by one or more sensors for measuring the temperature of one or more windings and/or one or more sensors for measuring the temperature of one or more bearings.

Preferably during the design of the device, the motor is chosen such that its maximum capacity in nominal operating conditions for which the device is intended is equal to or preferably greater by a maximum of 5% or less than the power of the consumer corresponding to the maximum capacity or the maximum power of the consumer in the nominal operating conditions concerned.

The invention also relates to a method for choosing an electric motor during the design of such a device for nominal operating conditions, characterised in that a motor is chosen with a power equal to or somewhat greater than the power of the consumer corresponding to the maximum capacity or maximum power of the consumer in the nominal operating conditions concerned.

The invention also relates to a method for choosing an electric motor during the design for nominal operating conditions of a device according to the invention for driving the consumer equipped with a controller for controlling the capacity or the power of the consumer, characterised in that a motor is chosen with a power equal to or somewhat greater than the power of the consumer, corresponding to the maximum capacity or maximum power of the consumer in the nominal operating conditions concerned.

An advantage of this method is that a motor can be chosen with a suitable power without having to take account of severe overdimensioning and doom scenarios of insufficient cooling and similar.

BRIEF DESCRIPTION OF THE DRAWINGS

With the intention of better showing the characteristics of the invention, a few preferred applications of a method and a device according to the invention for protecting the motor of a consumer are described hereinafter by way of an example, without any limiting nature, with reference to the accompanying drawings, wherein.

DETAILED DESCRIPTION OF THE INVENTION

Figure 1:
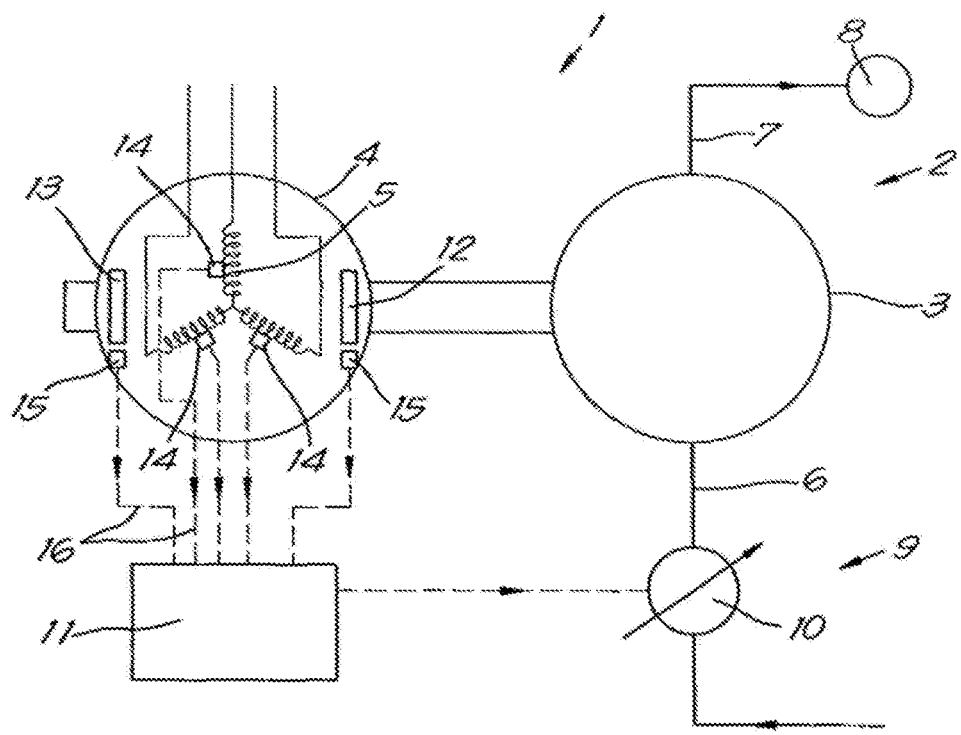
FIG. 1 schematically shows a device according to the invention.

By way of an example a device 1 is shown in FIG. 1 with a consumer 2 in the form of a compressor element 3 mechanically driven by a three-phase electric motor 4 with three windings 5, more specifically one winding per phase.

The motor 4 comprises a rotor that is rotatably affixed in a housing by means of bearings, respectively one or more bearings 12 on the driven end (DE) of the motor 4, and one or more bearings 13 on the non-driven end (NDE) of the motor 4.

The compressor element 3 is provided with an inlet 6 for the supply of a gas to be compressed and an outlet 7 for the supply of compressed gas to a distribution network 8 for compressed gas.

The compressor element 3 is further provided with means 9 to limit the capacity, in other words the flow or the power, of the compressor element 3, whereby in this case these means 9 are formed by a throttle valve 10 or alternatively by inlet guide vanes in the inlet 6.

In this case the means 9 are controlled by a controller 11 as a function of signals that originate from sensors 14 for the direct measurement of the temperature of one or more aforementioned windings 5 and/or sensors 15 for the direct measurement of the temperature of one or more bearings 12 and/or 13, whereby in this case these signals are fed back to the controller 11 via electric wiring 16.

In the example of FIG. 1, each winding 5 and each bearing 12 and 13 is provided with such a sensor 14 or 15.

For each sensor 14 and/or 15 concerned the controller 11 is provided with a preset maximum value of the temperature of the windings 5 and bearings 12, above which the maximum capacity of the compressor element must be limited to prevent a further increase of this temperature and to protect the motor against overheating.

To this end the temperatures measured with the sensors 14 and/or 15 are compared to the corresponding pre-input maximum values for each sensor 14 and/or 15, continuously or with a certain frequency.

As soon as one of the measured temperatures reaches or exceeds the corresponding value, the controller is programmed such that the maximum capacity and/or the maximum power of the compressor element 3 is limited, for example by turning the throttle valve 10 or the inlet guide vanes closed by a set value, for example over an angle that amounts to 5 to 10% of the entire range of the throttle valve 10 or the inlet guide vanes.

If after the passage of time at a reduced maximum capacity all measured temperatures have fallen below a set lower threshold value for every sensor, the controller 11 is equipped to increase the maximum permissible capacity again, after a set time span or otherwise, for example to the initial maximum value for which the device 1 has been designed or by opening the throttle valve 10 again by small incremental steps until the measured temperatures have reached the set lower threshold value, such that at that time the compressor supplies its maximum capacity that is possible at that time without the risk of damage in the given operating conditions.

The set maximum values of the temperatures and the set lower threshold values of the temperatures of each sensor can be the same or different.

The controller 11 can optionally be provided with an algorithm for a self-diagnosis of the condition of the sensors 14 on the windings 5 by a mutual comparison of the temperatures measured by the three sensors 14 concerned, whereby a sensor is considered to be defective when the temperature measured by this sensor 14 differs from the temperatures measured by the other two sensors 14 by more than a certain set value. In such a case, the controller 11 can ignore the measurement from the defective sensor 14 and/or give an indication to an operator so that the sensor can be checked and/or replaced if need be.

Figure 2:
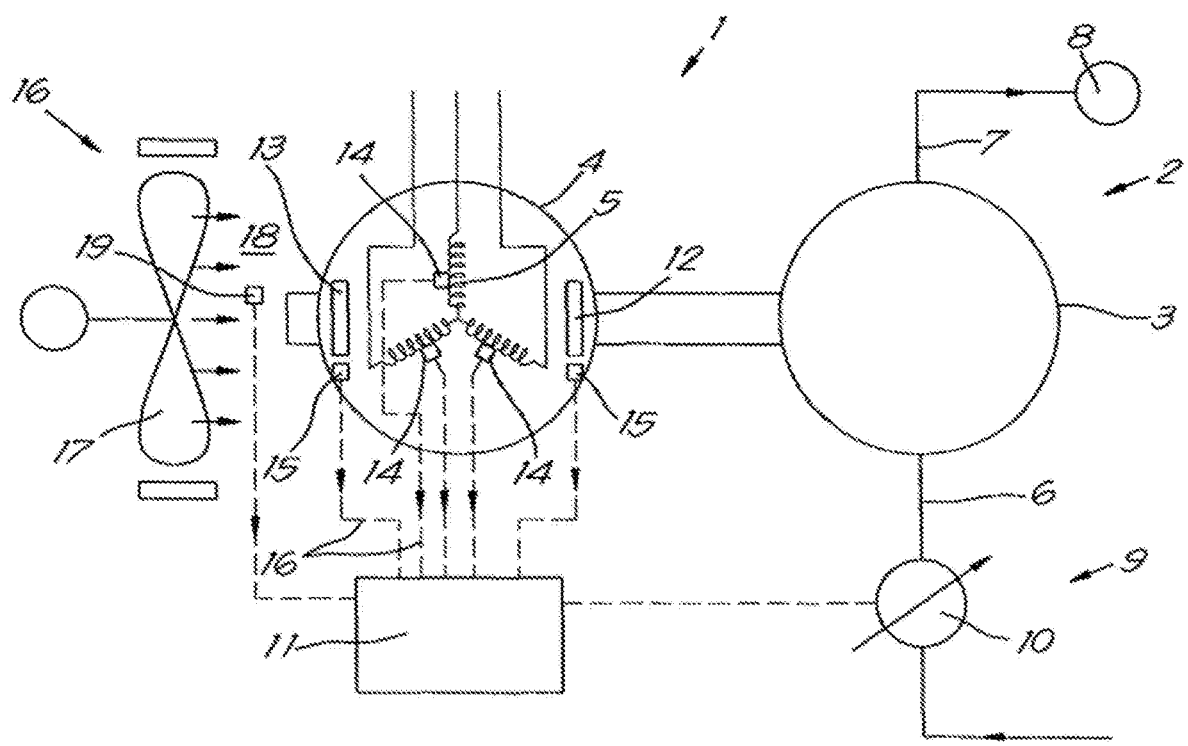
FIG. 2 shows a variant of the device of FIG. 1 but with extra cooling of the motor.

The device of FIG. 2 differs from that of FIG. 1 in that in this case cooling 16 is provided, which in this case is formed by a fan 17 that blows surrounding air as a coolant 18 around the motor 4 and that an additional sensor 19 is provided for the measurement of the inlet temperature of the coolant 18.

For each sensor 14 and 15 or for at least a proportion of them, in this case a maximum value is entered in the controller 11 beforehand for the temperature difference between the measured temperature of the sensor 14 or 15 concerned and the inlet temperature of the coolant measured by the temperature 19.

In this case, the method according to the invention comprises the following alternative or additional steps;

for at least one sensor 14 or 15, the determination of the temperature difference between the aforementioned inlet temperature of the coolant 18 and the measured temperature of the sensor 14 or 15 concerned;

the comparison of this temperature difference to the corresponding pre-entered maximum value of the temperature difference for the sensor 14 or 15 concerned, continuously or at time intervals the limitation of the capacity and/or the power of the compressor element 3 by turning the throttle valve 10 over a preset angle when the temperature difference of at least one of the sensors has reached or exceeded the corresponding maximum value.

The limitation of the capacity of the compressor element 3 on the basis of the measured absolute temperatures or on the basis of the temperature differences can be applied separately or in combination.

Figure 3:
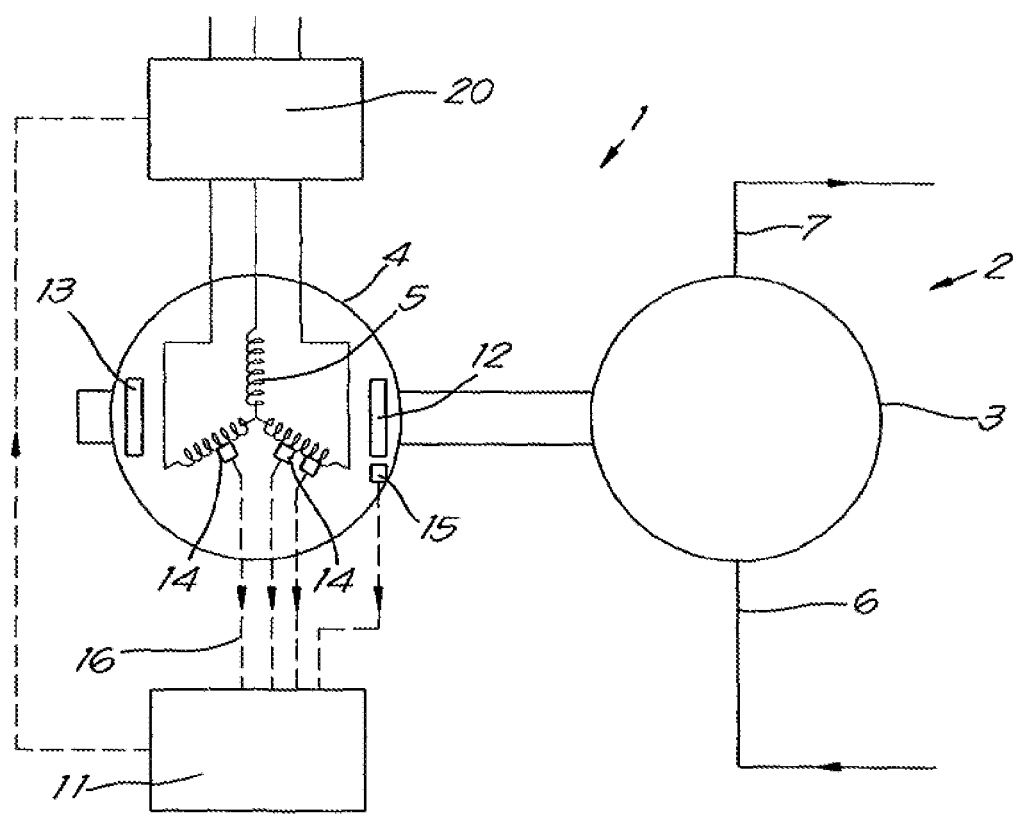
FIG. 3 shows another variant of the device of FIG. 1.

FIG. 3 shows an alternative device according to the invention such as that of FIG. 1, but with the difference that the means 9 for controlling the capacity or power of the compressor element 3 are now formed by a variable speed controller 20 of the motor 4, and thus of the compressor element 3, to replace the throttle valve 10 or inlet guide vanes of FIG. 1.

In this case, the protection of the motor 4 against overheating can be done by an analogous algorithm as in the case of the device of FIG. 1, but with the difference that in this case the capacity is limited by the controller 11 by reducing the speed by a certain value.

An additional difference to the embodiment of FIG. 1 is that with the last embodiment not every winding 5 and not every bearing 12, 13 is provided with a sensor 14 or 15, and that a number of sensors 14 are provided in one winding 5 over the length of the winding 5 concerned.

The means 9 for controlling the capacity of the consumer 2 are limited to the throttle valve 10, inlet guide vanes or variable speed controller 20 described above, but can be realised in other ways, for example in the form of variable diffuser vanes or similar. A combination of a number of types of means 9 also forms part of the possibilities.

The invention is not limited to application to a compressor element 3 as a consumer 2, but for example can also be applied to expanders; pumps; ventilators; coolers and similar.

It is emphasised that the method according to the invention does not make use of current, measurements or estimated parameters, but is only based on direct temperature measurements.

The present invention is by no means limited to the embodiments described as an example and shown in the drawings, but such a method and device can be realised according to different variants without departing from the scope of the invention.

The invention claimed is:

1. A method for protecting an electric motor of a motor driven consumer equipped with a controller for controlling the capacity or the power of the consumer, wherein the method comprises the following steps:

determining a thermal condition of the electric motor by a direct measurement on the electric motor, wherein the electric motor is provided with one or more electric windings and with one or more bearings, wherein the determining of the thermal condition of the electric motor comprises the step of measuring a temperature of one or more windings and/or of one or more bearings;

limiting a maximum capacity or a maximum power of the consumer as a function of the thermal condition when the temperature of the one or more windings and/or of the one or more bearings is greater than a set maximum value; and setting a lower threshold value at a temperature lower than the set maximum value, wherein if the thermal condition is below the lower threshold value, the electric motor is able to be set to the maximum capacity or the maximum power.

2. The method according to claim 1, wherein, in the measurement of the temperature use is made of one or more sensors whose signal is fed back directly to the controller.

3. The method according to claim 2, wherein at least one winding of the electric motor includes two or more sensors provided along the length of the at least one winding.

4. The method according to claim 2, wherein for each of at least a proportion of the sensors the set maximum value of the temperature is entered in the controller beforehand and the method comprises the following steps:

for at least one sensor, comparing the measured temperature to the corresponding set maximum value entered beforehand, continuously or at certain time intervals;

limiting the maximum capacity and/or the maximum power of the consumer by a preset value when the measured temperature of the sensor has reached or exceeded the corresponding set maximum value.

5. The method according to claim 4, wherein when the temperature of the sensor has fallen to below the corresponding set maximum value, the maximum capacity or the maximum power of the consumer is increased again until the set maximum value concerned is reached.

6. The method according to claim 2, wherein the electric motor is provided with two or more sensors for measuring the temperature and the method comprises the step of limiting the maximum capacity or the maximum power of the consumer when, for at least one of these sensors, the measured temperature has reached or exceeded the corresponding set maximum value.

7. The method according to claim 6, wherein the electric motor is provided with three or more sensors for measuring the temperature of the windings and the method comprises the step of conducting a self-diagnosis of the sensors by a mutual comparison of the temperatures measured by the sensors and considering a sensor as defective when the temperature measured by this sensor differs from the temperatures measured by the other sensors by more than a certain set value.

8. The method according to claim 2, wherein the electric motor is provided with cooling using a coolant, and for each of at least a proportion of the aforementioned sensors a maximum value is entered in the controller beforehand for the temperature difference between the measured temperature of the sensor concerned and the inlet temperature of the coolant, wherein the method comprises the following steps:
 the determining an inlet temperature of the coolant at a cooling input;
 for at least one sensor, determining a temperature difference between the inlet temperature of the coolant and the measured temperature of the sensor concerned;
 comparing this temperature difference to the corresponding maximum value of the temperature difference entered beforehand for the sensor concerned, continuously or with time intervals; and
 limiting a capacity and/or a power of the consumer by a preset value when the temperature difference of at least one of the sensors has reached or exceeded the corresponding maximum value.

9. The method according to claim 8, wherein the maximum capacity or the maximum power of the consumer is set higher again after the measured temperature differences have fallen below a set value for each sensor, after the passage of a set time interval or otherwise.

10. The method according to claim 1, wherein the determining of the thermal condition of the electric motor depends on one of the following characteristics or any combination of these characteristics:
 an absolute temperature of at least one or all of the windings, at one single point of the winding or at a number of points over the length of the winding;
 a temperature difference between at least one winding and an inlet temperature of the coolant; and
 an absolute temperature of at least one bearing.

11. The method according to claim 1, wherein the consumer is one from the following non-exhaustive list:
 a compressor;
 an expander;
 a pump;
 a ventilator;
 a cooler.

12. The method according to claim 1, wherein the consumer is provided with means to limit the power, wherein said means are controlled by the controller for controlling the capacity or the power of the consumer.

13. The method according to claim 12, wherein the means for limiting the capacity or the power are formed by one or more means from the following non-exhaustive list:
 variable inlet vanes (IGV or Inlet Guide Vanes);
 variable diffuser vanes;
 a throttle valve;
 variable speed.

14. The method according to claim 11, wherein the consumer is a centrifugal compressor with controlled variable inlet vanes that can be rotated over a range from maximum open to maximum closed, wherein, for the limiting of the capacity or the power of the consumer when the set maximum value of a measured temperature or a temperature difference is reached or exceeded, inlet vanes are rotated over 5 to 10% of a range in a direction of rotation from open to closed.

15. The method according to claim 11, wherein the consumer is a compressor with a speed control of the electric motor, wherein, to limit the capacity or the power of the consumer when the maximum value of a measured temperature or a temperature difference is reached or exceeded, a speed is adjusted over 5 to 10% downwards.

16. The method according to claim 1, wherein the method is only based on temperature measurements.

17. A device for protecting an electric motor of a motor driven consumer equipped with a controller for controlling a capacity or a power of the consumer, wherein the device comprises:
 one or more sensors to determine a thermal condition of the electric motor by direct measurement on the electric motor, wherein the electric motor is provided with one or more electric windings and with one or more bearings and the one or more sensors measure a temperature of the one or more windings and/or the one or more sensors measure a temperature of one or more bearings, and
 the controller is configured to limit a maximum capacity or a maximum power of the consumer as a function of the thermal condition when the temperature of the one or more windings and/or of the one or more bearings is greater than a set maximum value and to control the electric motor to the maximum capacity or the maximum power when the thermal condition is below a lower threshold value, said lower threshold value being set lower than the set maximum value.

18. The device according to claim 17, wherein the set maximum value of a temperature is set for each of at least a proportion of the sensors and wherein the controller is configured such that when the measured temperature reaches or exceeds the corresponding set maximum value, the controller will decrease the maximum capacity or the maximum power of the consumer.

19. The device according to claim 17, wherein the electric motor is provided with cooling using a coolant and a sensor for measuring an inlet temperature of the coolant at the input of the cooling, wherein the maximum value is set for each of at least a proportion of the aforementioned sensors for a temperature difference between the measured temperature of a sensor concerned and the inlet temperature of the coolant, and wherein the controller is configured such that when the temperature difference reaches or exceeds the corresponding set maximum value, the controller will reduce the maximum capacity or the maximum power of the consumer.

20. The device according to claim 17, wherein the controller makes use of only the sensors for the temperature.

21. The device according to claim 17, wherein the electric motor is chosen for nominal operating conditions such that its maximum power is equal to or somewhat greater than the power of the consumer corresponding to the maximum capacity or the maximum power of the consumer in the nominal operating conditions concerned.

22. The device according to claim 17, wherein the electric motor is chosen for nominal operating conditions such that its maximum power is a maximum of 5% greater than or equal to the power of the consumer corresponding to the maximum capacity or the maximum power of the consumer in the nominal operating conditions concerned.

23. A method for choosing the electric motor during the design of a device according to claim 17 for nominal operating conditions, for driving the consumer equipped with a controller for controlling the capacity or the power of the consumer, wherein the electric motor is chosen with a power equal to or somewhat greater than the power of the consumer, corresponding to the maximum capacity or maximum power of the consumer in the nominal operating conditions concerned.

24. A device for protecting an electric motor of a motor driven consumer equipped with a controller for controlling the capacity or the power of the consumer, comprising:

one or more first sensors for determining the thermal condition of the electric motor by a direct measurement on the electric motor, wherein the electric motor is provided with one or more electric windings and with one or more bearings and the one or more first sensors measure a temperature of the one or more windings and/or the one or more first sensors measure a temperature of one or more bearings, a limiter for limiting a maximum capacity or a maximum power of the consumer as a function of the thermal condition when the temperature of the one or more windings and/or of the one or more bearings is greater than a set maximum value, wherein the controller is configured to control the limiter and control the electric motor to the maximum capacity or the maximum power when the thermal condition is below a lower threshold value, said lower threshold value being set lower than the set maximum value, and wherein the electric motor is provided with cooling using a coolant and a second sensor for measuring an inlet temperature of the coolant at an input of the cooling, wherein a maximum value of a temperature difference between the measured temperature of the one or more first sensors and the inlet temperature is set, and wherein the controller is configured such that when the temperature difference reaches or exceeds the set maximum value of the difference, the controller will reduce the maximum capacity or the maximum power of the consumer.

* * * * *